US012771377B2

(12) United States Patent
Petersen et al.

(10) Patent No.: US 12,771,377 B2
(45) Date of Patent: Oct. 20, 2026

(54) ADC CIRCUIT AND METHOD OF PERFORMING MULTI-GAIN MIXING

(71) Applicant: ESS Technology, Inc., San Jose, CA (US)

(72) Inventors: Christian L. Petersen, Burnaby (CA); Dustin Forman, Kelowna (CA)

(73) Assignee: ESS Technology, Inc., San Jose, CA (US)

( * ) Notice: Subject to any disclaimer, the term of this patent is extended or adjusted under 35 U.S.C. 154(b) by 94 days.

(21) Appl. No.: 19/062,674

(22) Filed: Feb. 25, 2025

(65) Prior Publication Data

US 2026/0254461 A1 Aug. 27, 2026

(51) Int. Cl.
*H03M 3/00* (2006.01)

(52) U.S. Cl.
CPC ............. *H03M 3/48* (2013.01); *H03M 3/466* (2013.01)

(58) Field of Classification Search
CPC ........... H03M 3/00; H03M 3/48; H03M 3/466
See application file for complete search history.

(56) References Cited

U.S. PATENT DOCUMENTS

| | | | | |
|---|---|---|---|---|
| 4,999,628 | A | 3/1991 | Kakubo et al. | |
| 5,714,956 | A | 2/1998 | Jahne et al. | |
| 6,271,780 | B1 | 8/2001 | Gong et al. | |
| 6,317,065 | B1 | 11/2001 | Raleigh et al. | |
| 6,333,707 | B1 | 12/2001 | Oberhammer et al. | |
| 6,445,328 | B1 | 9/2002 | Francis | |
| 6,621,433 | B1 | 9/2003 | Hertz | |
| 6,683,552 | B2 | 1/2004 | Noll et al. | |
| 7,221,299 | B2 * | 5/2007 | Bjornsen | H03M 1/0641 341/131 |
| 7,746,255 | B1 * | 6/2010 | Huang | H03M 1/0607 341/122 |
| 8,717,211 | B2 | 5/2014 | Miao et al. | |

(Continued)

FOREIGN PATENT DOCUMENTS

GB 2537697 A 10/2016

OTHER PUBLICATIONS

Cruz, Pedro et al., Architecture for Dynamic Range Extension of Analogue-to-Digital Conversion, Instituto de Telecomunicações, Universidade de Aveiro Campus Universitário de Santiago, Aveiro, Portugal, 4 pages, 2010.

(Continued)

*Primary Examiner* — Lam T Mai
(74) *Attorney, Agent, or Firm* — Robert D. Atkins; PATENT LAW GROUP: Atkins and Associates, P.C.

(57) ABSTRACT

An ADC circuit has a plurality of distributed ADC paths each receiving a common analog input signal and providing a digital output signal. Each distributed ADC path has an ADC converting the common analog input signal to a digital signal, and a DPU coupled to an output of the ADC. A first DPU receives a first digital signal from a first ADC and a second digital signal from a second DPU and selects a mixture of the first digital signal and second digital signal as the digital output signal based on a proximity of the first digital signal to a first threshold and a second threshold. The first DPU selects the second digital signal when the first digital signal is less than the first threshold and selects the first digital signal when the first digital signal is greater than the second threshold.

20 Claims, 9 Drawing Sheets

(56) References Cited

U.S. PATENT DOCUMENTS

| | | | | |
|---|---|---|---|---|
| 9,071,267 | B1 | 6/2015 | Schneider et al. | |
| 9,143,153 | B1 * | 9/2015 | Tai | H03M 1/164 |
| 9,391,576 | B1 | 7/2016 | Satoskar et al. | |
| 9,762,255 | B1 * | 9/2017 | Satoskar | H03M 1/0626 |
| 10,355,709 | B1 * | 7/2019 | Sharma | H03M 3/464 |
| 10,425,095 | B1 * | 9/2019 | Price | H03M 1/365 |
| 10,763,889 | B1 | 9/2020 | Agarwal et al. | |
| 10,931,299 | B1 * | 2/2021 | Kinyua | H03M 3/412 |
| 11,251,807 | B1 * | 2/2022 | Ren | H03M 3/396 |
| 11,271,578 | B2 * | 3/2022 | Molina | H03M 1/0697 |
| 11,606,100 | B1 | 3/2023 | Xu et al. | |
| 11,876,524 | B2 * | 1/2024 | Bolatkale | H03M 1/001 |
| 2004/0001018 | A1 * | 1/2004 | Hales | H03M 1/004 341/155 |
| 2005/0275577 | A1 * | 12/2005 | Bjornsen | H03M 3/46 341/155 |
| 2007/0120721 | A1 | 5/2007 | Caduff et al. | |
| 2010/0052967 | A1 * | 3/2010 | Currivan | H03M 1/188 341/155 |
| 2010/0176980 | A1 | 7/2010 | Breitschadel et al. | |
| 2012/0112946 | A1 | 5/2012 | Lovitt | |
| 2013/0002467 | A1 * | 1/2013 | Wang | H03M 1/145 341/172 |
| 2015/0381130 | A1 | 12/2015 | Das et al. | |
| 2016/0080865 | A1 | 3/2016 | He et al. | |
| 2016/0286310 | A1 | 9/2016 | Das et al. | |
| 2016/0365081 | A1 | 12/2016 | Satoskar et al. | |
| 2017/0155398 | A1 * | 6/2017 | Narayanan | H03M 1/0609 |
| 2019/0158103 | A1 * | 5/2019 | Sundström | H03M 1/0675 |
| 2019/0363730 | A1 * | 11/2019 | Erol | H03M 1/0665 |
| 2024/0154592 | A1 | 5/2024 | Howlett et al. | |
| 2025/0211878 | A1 * | 6/2025 | Yanagisawa | H03M 1/186 |

OTHER PUBLICATIONS

Utter, Alexander et al., AdaptivenTwo-Channel Automatic Gain Control System, IEEEAC paper #1113, Version 2, pp. 1-8, 2005.

* cited by examiner

- PRIOR ART -

*- PRIOR ART -*

ADC CIRCUIT AND METHOD OF PERFORMING MULTI-GAIN MIXING

FIELD OF THE INVENTION

The present invention relates in general to analog-to-digital conversion (ADC) and, more particularly, to an ADC circuit and method of performing multi-gain mixing.

BACKGROUND OF THE INVENTION

A mixed signal electrical circuit typically uses a combination of analog and digital signal processing. A portion of the mixed signal electrical circuit contains analog circuits to process an analog signal, and a portion of the mixed signal electrical circuit contains a digital circuit to process a digital signal. When transmitting an analog signal directly, all noise in the system and transmission is added to the analog signal, reducing its quality. It is desirable or necessary to convert the analog signal to a digital representation. Digitizing the signal enables noise-free transmission, storage, and processing. An ADC typically performs the analog to digital conversion. An ADC converts a continuous-time and continuous-amplitude analog signal to a discrete-time and discrete-amplitude digital signal. Likewise, the digital signal must be converted to an analog representation. A digital-to-analog converter (DAC) typically performs the digital to analog conversion.

In the case of the ADC, the conversion involves quantization of the input signal, so it necessarily introduces a small amount of quantization error. Furthermore, instead of continuously performing the conversion, an ADC does the conversion periodically, sampling the input, and limiting the allowable bandwidth of the input signal. The performance of an ADC is primarily characterized by its bandwidth and signal-to-noise and distortion ratio (SNDR). The bandwidth of an ADC is characterized primarily by its sampling rate. The SNDR of an ADC is influenced by many factors, including resolution, linearity, aliasing, jitter, and accuracy (how well the quantization levels match the true analog signal).

A conventional ADC 80 is shown in FIG. 1 configured for variable gain in a single path. An analog input signal is applied at input terminal 82, as coupled to an input of programmable gain amplifier (PGA) 84. ADC 86 converts the analog input signal to a digital signal and decimation filter reduces high-frequency noise. The digital signal is then routed to DSP 90 and to output terminal 92. DSP 90 dynamically controls the gain of PGA 84. PGA 84, ADC 86, decimation filter 88, and DSP 90 represent a signal ADC path 94 to reconstruct the signal with the extra DNR provided. Digital gain 96 compensates for the analog gain and is commonly known as dynamic range enhancement, auto ranging enhancement, and hybrid gain control.

In another example of a conventional variable gain ADC 100 in FIG. 2, an analog input signal is applied at input terminal 106. Multiplexer 110 selectively routes the analog input signal to PGA 112 or PGA 114. ADC 120 converts the analog input signal from PGA 112 to a digital signal. ADC 122 converts the analog input signal from PGA 114 to a digital signal. Multiplexer 124 selects either the digital signal from ADC 120 or the digital signal from ADC 122. Buffer 126 buffers the selected digital signal to DSP 128. The output of DSP 128 is available to cloud 132. DSP 128 controls multiplexer 110, PGA 112, PGA 114, ADC 120, ADC 122, and multiplexer 124 via control line 130 to select path 136 from input terminal 106 through multiplexer 110, PGA 112, ADC 120, and multiplexer 124 to buffer 126 and DSP 128, or to select path 138 from input terminal 106 through multiplexer 110, PGA 114, ADC 122, and multiplexer 124 to buffer 126 and DSP 128.

The variable gain in a single path concept, such as ADC path 94 with PGA 84, and alternatively in ADC path 136 with PGA 112 and ADC path 138 with PGA 114, have limitations. Gain steps are typically large due to finite levels of the PGA. The ADC path requires dynamically stepping the gain while trying to keep the input signal from overloading the path. DC gain of the path changes steps with signal gain change, leaving audible artifacts on gain switching. Gain needs to switch when signal is small to avoid sudden output steps. Phase shift at higher frequency is not constant.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims'equivalents as supported by the following disclosure and drawings.

Figure 1:
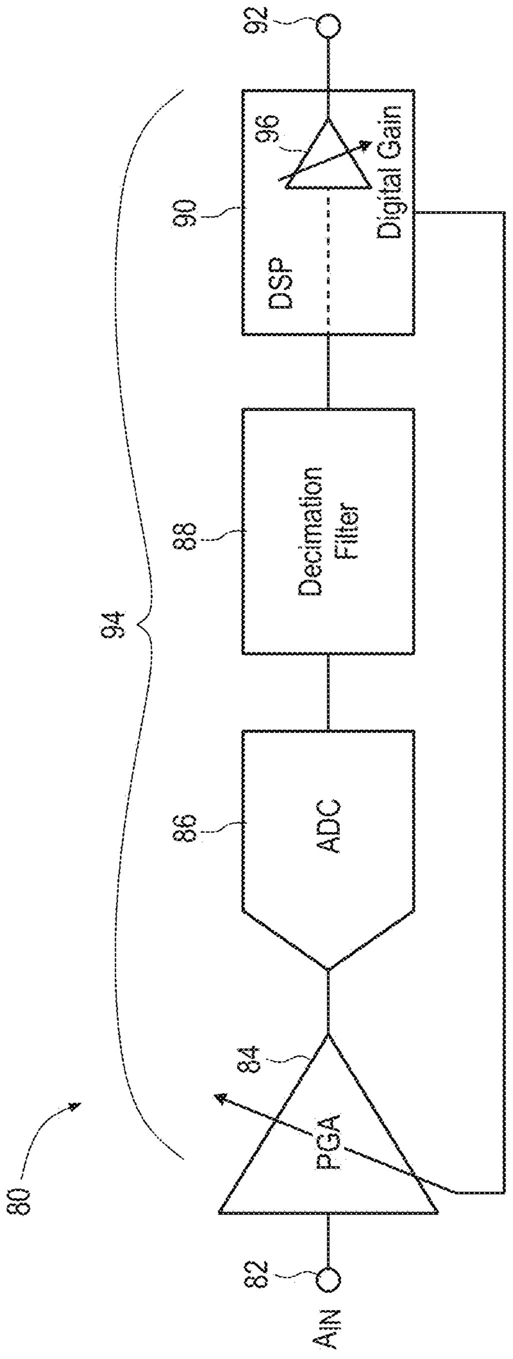
FIG. 1 illustrates a block diagram of a conventional variable gain in a single path ADC.
Figure 2:
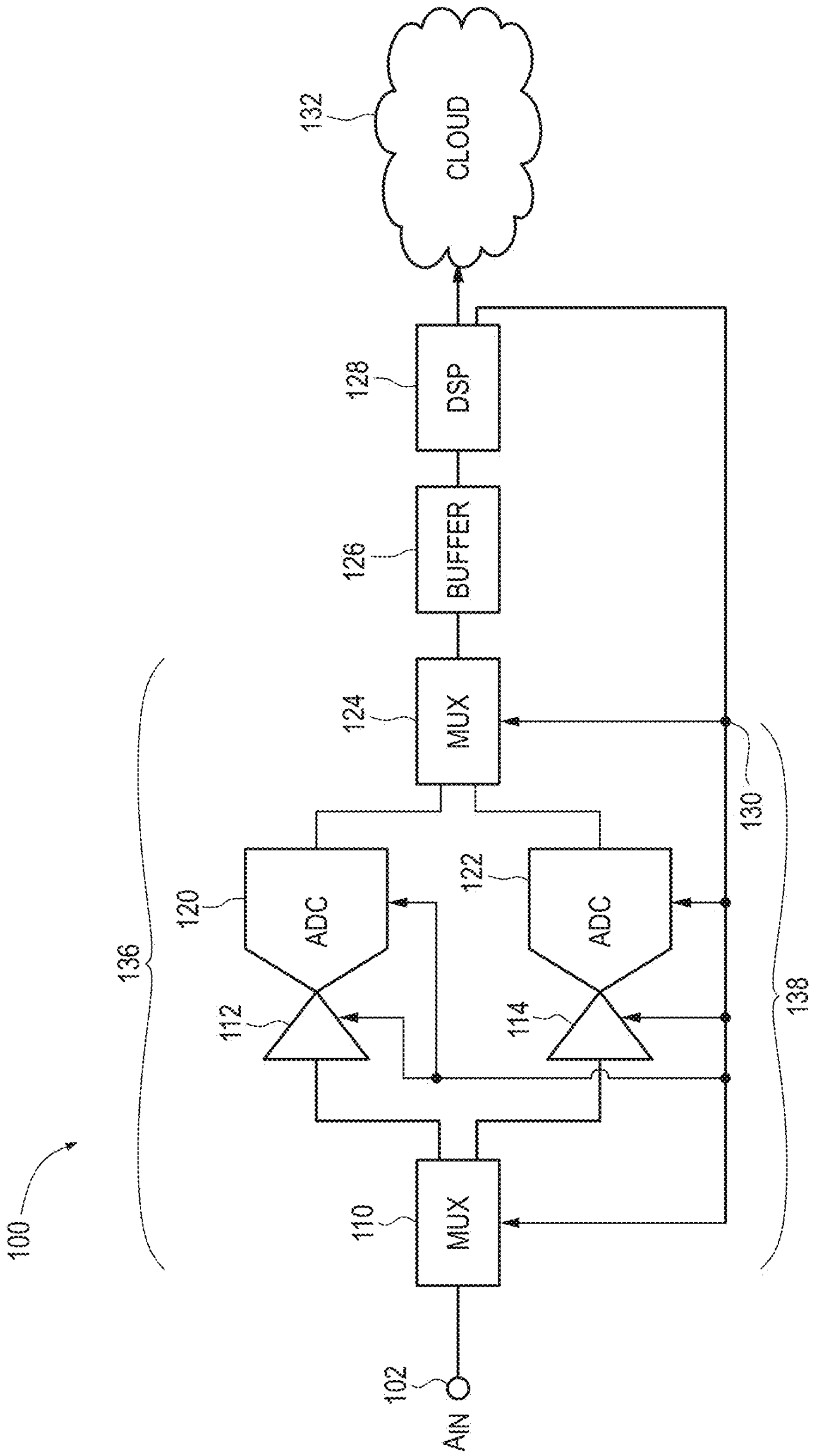
FIG. 2 illustrates a block diagram of another variation of the conventional variable gain ADC.
Figure 3:
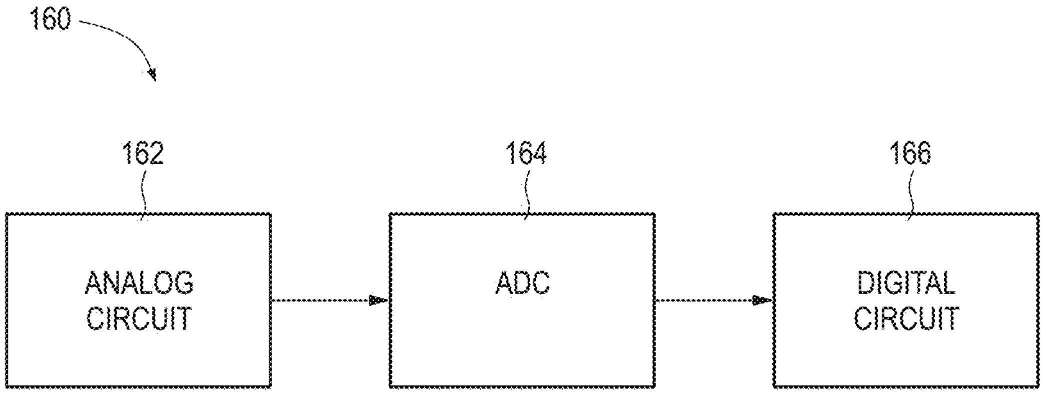
FIG. 3 illustrates a simplified block diagram of a mixed signal electrical circuit.

A mixed signal electrical circuit typically uses a combination of analog signal processing and digital signal processing. FIG. 3 illustrates mixed signal electrical circuit 160 including analog circuit 162, ADC 164, and digital circuit 166. Analog circuit 162 processes an analog signal. When transmitting an analog signal directly, all noise in the system and transmission is added to the analog signal, reducing its quality. It is desirable, and often necessary, to convert the analog signal to a digital representation. Digitizing the signal enables noise-free transmission, storage, and processing. ADC 164 converts a continuous-time and continuous-amplitude analog signal to a discrete-time and discrete-amplitude digital signal. Digital circuit 166 processes the digital signal. Mixed signal electrical circuit 160 has many applications in electrical circuits, such as frequency synthesizers, switch mode power supplies, and motor controls, just to name a few.

Figure 4:
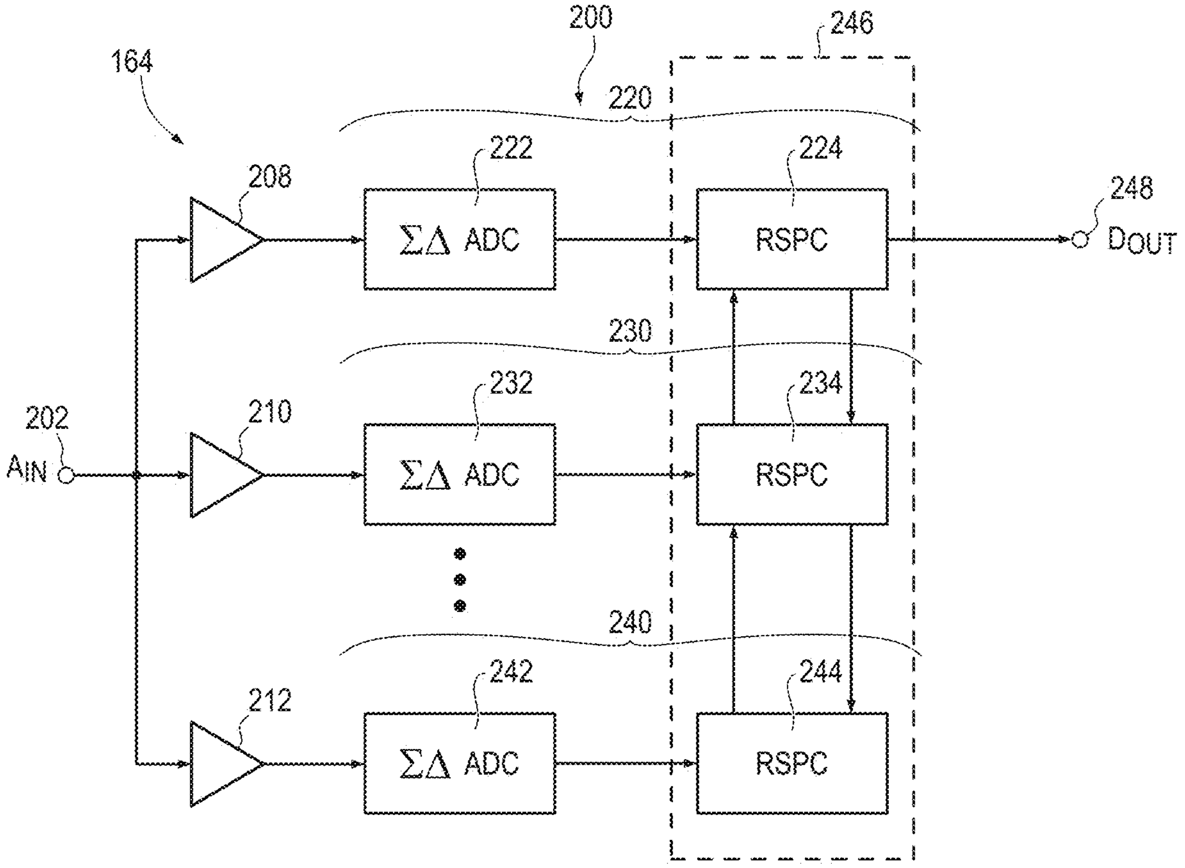
FIG. 4 illustrates a simplified block diagram of a fixed gain multiple path ADC with distributed real-time signal processing controllers (RPSCs)

FIG. 4 illustrates a simplified implementation of ADC 164. Multi-gain mixing (MGM) circuit 200 is a fixed gain on multiple paths type ADC. A common analog input signal $A_{IN}$ is applied to input terminal 202. In one embodiment, the analog input signal $A_{IN}$ is an audio type signal with an amplitude ranging from millivolts to low volts and frequency up to say 400.0 KHz. Input terminal 202 is coupled to an input of fixed gain amplifier (FGA) 208, an input of FGA 210, and an input of FGA 212. In one embodiment, FGA 208 has a fixed gain of 0 dB, FGA 210 has a fixed gain of 10 dB, and FGA 212 has a fixed gain of 20 dB. The output of FGA 208 is coupled to an input of ADC path 220. ADC path 220 includes ADC 222 and real-time signal processing controller (RSPC) 224. The output of FGA 210 is coupled to an input of ADC path 230. ADC path 230 includes ADC 232 and RSPC 234. The output of FGA 212 is coupled to an input of ADC path 240. ADC path 240 includes ADC 242 and RSPC 244.

ADC 222, 232, and 242 can be sigma-delta type ADC. Sigma-delta (ΣΔ) modulation is an oversampling method for encoding signals into low-bit depth digital signals at a high sample frequency, as part of the ΣΔ ADC. The ΣΔ ADC encodes an analog signal using high-frequency ΣΔ modulation and then applies a digital filter to demodulate it to a high-bit digital output at a lower sampling-frequency. ΣΔ modulation achieves high quality by utilizing a negative feedback loop during quantization to the lower bit depth that continuously corrects quantization error and moves quantization noise to higher frequencies, well above the signal bandwidth. The temporary use of a low bit depth signal at a higher sampling frequency simplifies circuit design and takes advantage of the efficiency and high accuracy.

RSPC 224, 234, and 244 are part of a distributed signal processing network 246. RSPC 244 communicates with RSPC 234, and RSPC 234 communicates with RSPC 224 in the distributed signal processing network 246. In other words, RSPC 244 receives the digital representation of the analog input signal $A_{IN}$ from ΣΔ ADC 242 and passes that result to RSPC 234. As RSPC 244 has only one input from ΣΔ ADC 242, the output of RSPC 244 is the digital representation of the analog input signal $A_{IN}$ from ΣΔ ADC 242. RSPC 234 receives the digital representation of the analog input signal $A_{IN}$ from ΣΔ ADC 232, as well as the digital representation of the analog input signal $A_{IN}$ from RSPC 244 and passes the selected signal to RSPC 224. The selected signal can be the digital representation of the analog input signal $A_{IN}$ from ΣΔ ADC 232, or the digital representation of the analog input signal $A_{IN}$ from ΣΔ ADC 242, or a mixture thereof, as discussed in detail infra. RSPC 224 receives the digital representation of the analog input signal $A_{IN}$ from ΣΔ ADC 222, as well as the selected digital representation of the analog input signal $A_{IN}$ from RSPC 232 and makes the determination as to which ΣΔ ADC or combination thereof did the best job of digitizing the analog input signal $A_{IN}$ and provides that digital representation to output terminal 248 as digital output signal $D_{OUT}$. RCSP 224, 234, and 244 are thus cascaded or daisy-chained together to mix, blend, or otherwise combine the multiple parallel ADC paths, each with different fixed gain, to optimize accuracy and minimize noise in the ADC conversion. As will be discussed, RSPCs 224, 234, and 244 work together to determine the optimal digital representation of the analog input signal $A_{IN}$ and then RSPC 224 provides the selected signal as digital output signal $D_{OUT}$ at output terminal 248. Although the present embodiment shows three ADC signal paths 220, 230, and 240, it is understood that MGM 200 can have any number N of ADC signal paths, e.g., two or more ADC signal paths.

The communication path between RSPCs 224, 234, and 244 is bi-directional so the network information could flow the other direction. RSPC 224 receives the digital representation of the analog input signal $A_{IN}$ from ΣΔ ADC 222 and passes that result to RSPC 234. RSPC 234 receives the digital representation of the analog input signal $A_{IN}$ from ΣΔ ADC 232, as well as the digital representation of the analog input signal $A_{IN}$ from RSPC 224 and passes the selected signal to RSPC 244. The selected signal can be the digital representation of the analog input signal $A_{IN}$ from ΣΔ ADC 232, or the digital representation of the analog input signal $A_{IN}$ from ΣΔ ADC 222, or a mixture thereof, as discussed in detail infra. RSPC 244 receives the digital representation of the analog input signal $A_{IN}$ from ΣΔ ADC 242, as well as the selected digital representation of the analog input signal $A_{IN}$ from RSPC 234 and makes the determination as to which ΣΔ ADC or combination thereof did the best job of digitizing the analog input signal $A_{IN}$ and provides that digital representation to an output terminal (not shown) of RSPC 244.

Distributed signal processing network 246 operates to optimize the conversion of the analog input signal $A_{IN}$ to a digital signal. In essence, distributed signal processing network 246 chooses the ADC path with the most gain without saturating or clipping the ADC. As will be shown, distributed signal processing network 246 mixes or blends the digital signals from ADC paths 220, 230, 240 at the digital level, using averaging algorithms, to achieve smaller conversion steps and optimize the accuracy of the digital representation of the analog input signal $A_{IN}$. The dynamic range (DR) of an ADC is defined as the ratio between the maximum voltage the ADC can reliably measure and the noise floor of the device. The DR specification is particularly important in applications, such as far-field audio recording, speech pickup, and professional studio recording. In most cases, the system dynamic range (DNR) is limited by the ADC noise floor. MGM 200 improves the DR of ADC circuit 164.

Figure 5:
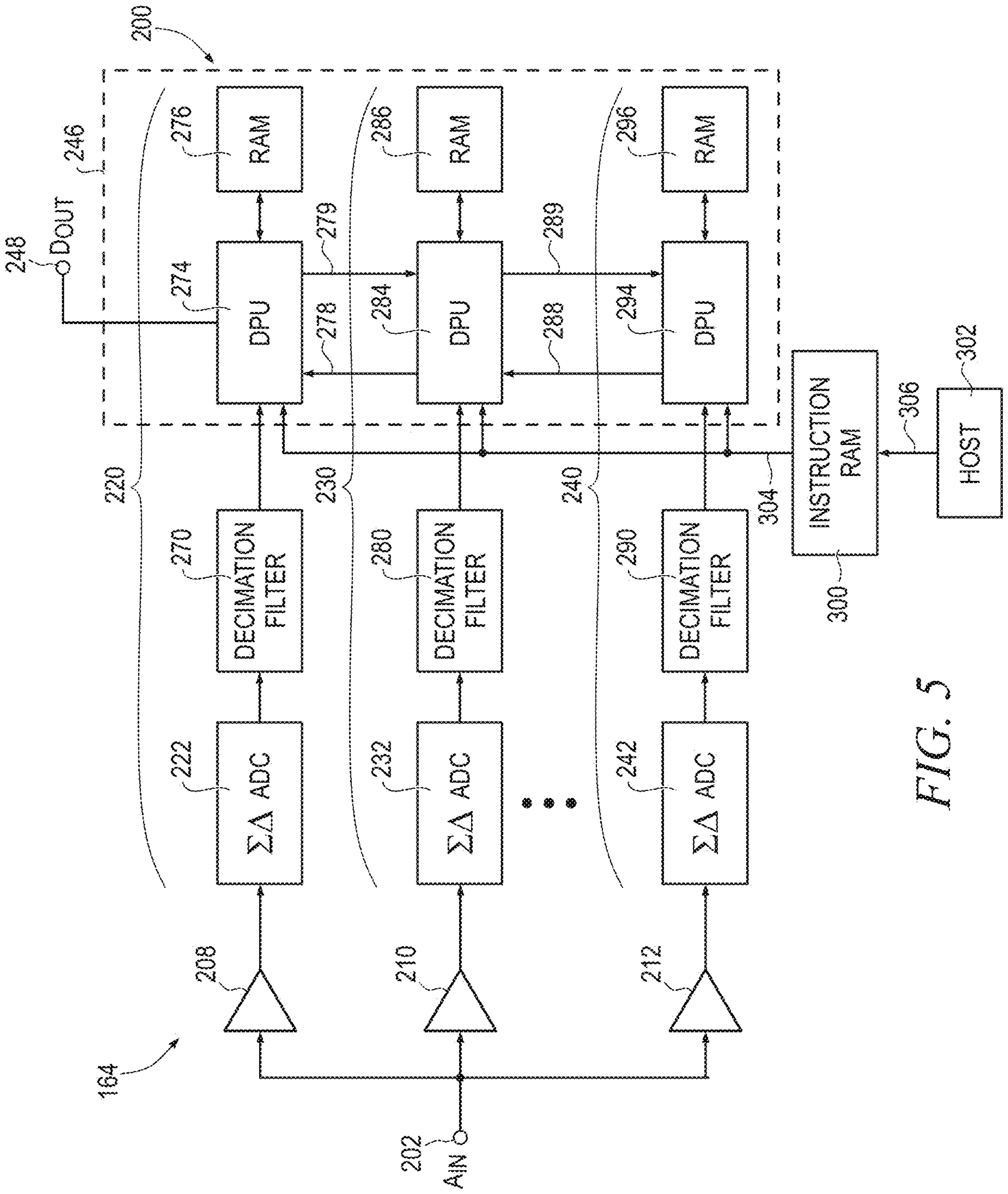
FIG. 5 illustrates further detail of the fixed gain multiple path ADC with distributed DPUs.

FIG. 5 shows further detail of MGM circuit 200. MGM circuit 200 uses three ADC paths 220, 230, and 240 with fixed but different gains connected to the same input are used to digitize the analog signal. Elements having a similar function are assigned the same reference number. The common analog input signal $A_{IN}$ is applied at input terminal 202. ADC path 220 includes FGA 208 and ΣΔ ADC 222, as described in FIG. 4, along with decimation filter 270, digital processing unit (DPU) 274, and random access memory (RAM) 276. ADC path 230 includes FGA 210, ΣΔ ADC 232, decimation filter 280, DPU 284, and RAM 286. ADC path 240 includes FGA 212, ΣΔ ADC 242, decimation filter 290, DPU 294, and RAM 296. Decimation filters 270, 280, and 290 serve to reduce the sample rate to reduce high-frequency noise and pass along the digital signal at a reduced data rate. Distributed signal processing network 246 is now shown as DPUs 274, 284, and 294 and RAM 276, 286, and 296. DPUs 274, 284, and 294 are capable of sample-to-sample real-time digital signal processing. In one embodiment, DPUs 274, 284, and 294 can be implemented as stack machines, or register or hybrid machines.

DPUs 274, 284, and 294 are part of a distributed signal processing network 246. DPU 284 communicates with DPU 274 by way of input line 278, and DPU 294 communicates with DPU 284 by way of input line 288 in distributed signal processing network 246. In other words, DPU 294 receives the digital representation of the analog input signal $A_{IN}$ from ΣΔ ADC 242 and passes that result to DPU 284. As DPU 294 has only one input from ΣΔ ADC 242, the output of DPU 294 is the digital representation of the analog input signal $A_{IN}$ from ΣΔ ADC 242. DPU 284 receives the digital representation of the analog input signal $A_{IN}$ from ΣΔ ADC 232, as well as the digital representation of the analog input signal $A_{IN}$ from DPU 294 and passes the selected signal to DPU 274. The selected signal can be the digital representation of the analog input signal $A_{IN}$ from ΣΔ ADC 232, or the digital representation of the analog input signal $A_{IN}$ from ΣΔ ADC 242, or a mixture thereof, as discussed in detail infra. DPU 274 receives the digital representation of the analog input signal $A_{IN}$ from ΣΔ ADC 222, as well as the selected digital representation of the analog input signal $A_{IN}$ from DPU 284 and makes the determination as to which ΣΔ ADC or combination thereof did the best job of digitizing the analog input signal $A_{IN}$ and provides that digital representation to output terminal 248 as digital output signal $D_{OUT}$. DPUs 274, 284, and 294 are thus cascaded or daisy-chained together to mix, blend, or otherwise combine the multiple parallel ADC paths, each with different fixed gain, to optimize accuracy and minimize noise in the ADC conversion. DPUs 274, 284, and 294 work together to determine the optimal digital representation of the analog input signal $A_{IN}$ and then DPU 274 provides the selected digital output signal $D_{OUT}$ at output terminal 248. Although the present embodiment shows three ADC signal paths 220, 230, and 240, it is understood that MGM 200 can have any number N of ADC signal paths, e.g., two or more ADC signal paths.

The communication path between DPUs 274, 284, and 294 is bi-directional so the network information could flow the other direction. In that case, DPU 274 receives the digital representation of the analog input signal $A_{IN}$ from ΣΔ ADC 222 and passes that result to DPU 284 by way of input line 279. DPU 284 receives the digital representation of the analog input signal $A_{IN}$ from ΣΔ ADC 232, as well as the digital representation of the analog input signal $A_{IN}$ from DPU 274 and passes the selected digital signal to DPU 294 by way of input line 289. The selected signal can be the digital representation of the analog input signal $A_{IN}$ from ΣΔ ADC 232, or the digital representation of the analog input signal $A_{IN}$ from ΣΔ ADC 222, or a mixture thereof. DPU 294 receives the digital representation of the analog input signal $A_{IN}$ from ΣΔ ADC 242, as well as the selected digital representation of the analog input signal $A_{IN}$ from ADC path 230, and makes the determination as to which ΣΔ ADC or combination thereof did the best job of digitizing the analog input signal $A_{IN}$ and provides that digital representation to an output terminal (not shown) of DPU 294.

DPUs 274, 284, and 294 are programmable digital computational or processing units or cores each executing an algorithm or set of coding loaded from instruction RAM 300. The algorithm can be coded in any programming language, such as assembly language, machine language, or other instruction set. The program coding can be stored on computer readable media, such as local RAM, read-only memory (ROM), erasable programmable ROM (EPROM), compact disks (CDs), digital versatile disks (DVDs), flash drives, and other optical media or mass storage medium. Alternatively, the program coding is downloaded electronically, such as from a host or cloud-based storage. In the present embodiment, the program coding is stored in installation RAM 300 and installed or loaded into DPUs 274, 284, and 294 by way of input line 302. For example, host 304 loads program coding into instruction RAM 300 via inter-integrated circuit (I2C) or serial peripheral interface (SPI) lines 306. Program codes updates can also be made available on mass storage medium, or downloadable from the host or cloud-based storage. The program coding, as provided on the computer readable media, represents a computer program product containing computer readable program code embodied in a non-transitory computer program medium. DPUs 274, 284, and 294 execute instructions set forth in the program coding to perform optimization of the MGM 200 in terms of determining the proper mixing, blending, or other combination of ADC paths 220, 230, and 240 to achieve an optimal digital representation of the analog input signal $A_{IN}$. The program coding is an integral part of the physical hardware performing the function of ADC, including FGAs 208, 210, and 212, ΣΔ ADCs 222, 232, and 242, decimation filters 270, 280, and 290, DPUs 274, 284, and 294, and RAM 276, 286, and 296.

Figure 6:
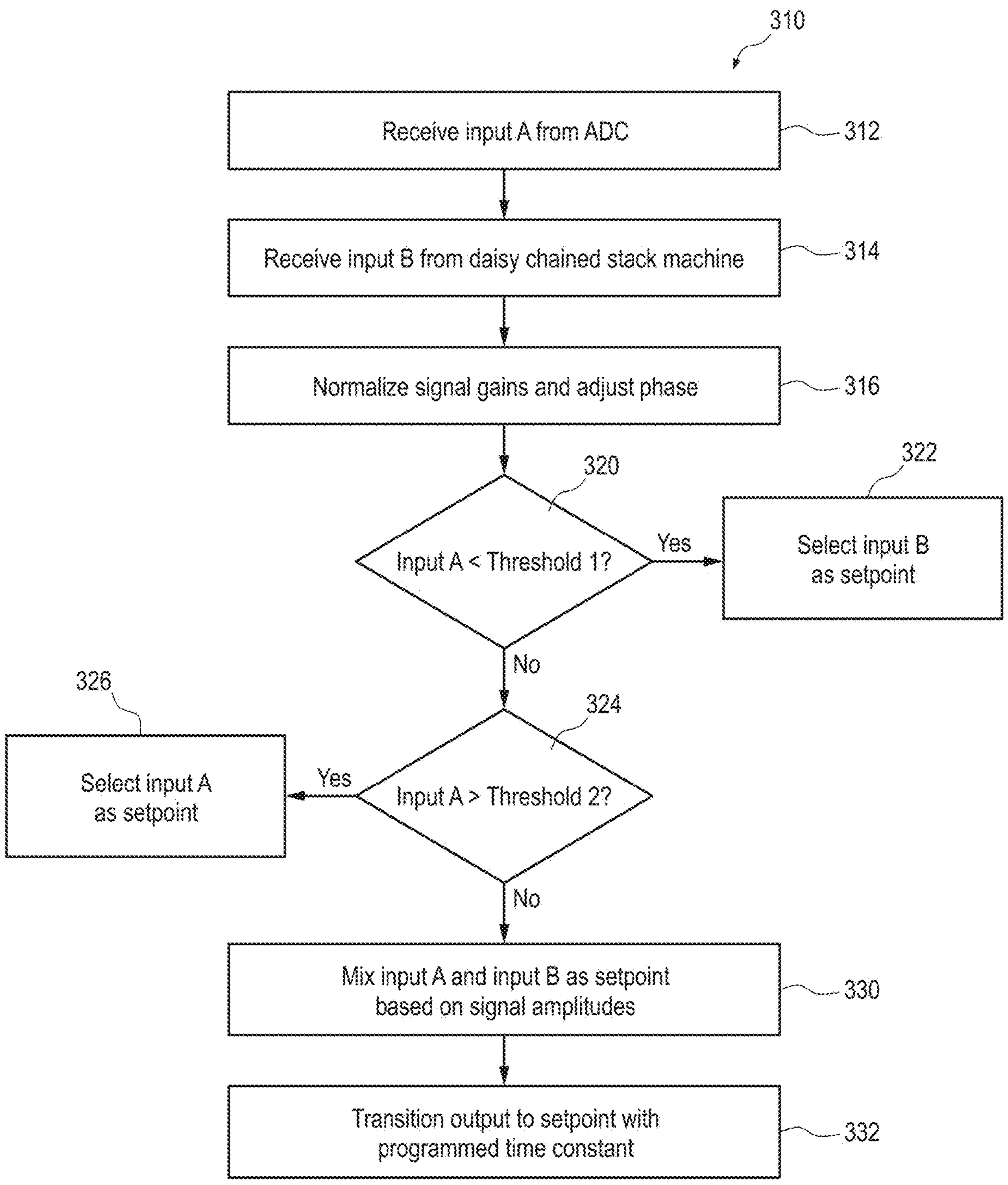
FIG. 6 is a flow chart of the operation of the distributed DPUs.

FIG. 6 is a flowchart 310 of the functional aspects of the program coding, as executed in DPUs 274, 284, and 294. First consider DPU 274. In step 312, DPU 274 receives the digital signal from ΣΔ ADC 222 and decimation filter 270. Concurrently, DPU 284 receives the digital signal from ΣΔ ADC 232 and decimation filter 280, and DPU 294 receives the digital signal from ΣΔ ADC 242 and decimation filter 290. In the context of flowchart 310, the digital signal from its own ADC path is referred to as input A. For example, DPU 284 receiving the digital signal from ΣΔ ADC 232 and decimation filter 280 is input A, relative to DPU 284. DPU 274 receiving the digital signal from ΣΔ ADC 222 and decimation filter 270 is input A, relative to DPU 274, and so on. DPUs 274, 284, and 294 are capable of sample-to-sample real-time digital signal processing of the digital signal from the respective ΣΔ ADC and decimation filter.

In step 314, DPU 274 receives the digital signal from DPU 284 on input line 278 and DPU 284 receives the digital signal from DPU 294 on input line 288. The nature of the digital signals from DPUs 284 and 294 is discussed below. In the context of flowchart 310, the digital signal from between two DPUs is referred to as input B. For example, DPU 284 receiving the digital signal from DPU 294 on input line 288 is input B, relative to DPU 284. DPU 274 receiving the digital signal from DPU 284 is input B, relative to DPU 274.

In step 316, DPUs 274, 284, and 294 normalize signal gains and adjust phase. Each ADC path has a different fixed gain from FGAs 208, 210, and 212. The digital signals from each ADC path are different based on the different fixed gains, albeit originating from the same analog input signal $A_{IN}$. The digital signals must be scaled or adjusted to compensate for different gains. That is, the digital signals are normalized or scaled to have an effective common gain for accurate and proper mixing or blending of the digital signals in DPUs 274, 284, and 294. The digital signals may be out-of-phase, for example, by propagating through different length signal paths in arrival at DPUs 274, 284, and 294, respectively. Phase adjustments are made to the digital signals to compensate for phase variation and align the digital signals for accurate and proper mixing or blending in DPUs 274, 284, and 294.

In step 320, for each DPU, input A is compared to threshold T1. Again, first consider DPU 274. Threshold T1 is stored in RAM 276 and represents a first decision point to change between ADC paths 220 and 230 or possibly mix the ADC paths 220 and 230. If input A is less than threshold T1, then input B from DPU 284 is selected as the present setpoint, as per step 322. In one embodiment, threshold T1 can be a digital equivalent of −120 dB. If input A is not less than threshold T1, then input A is compared to threshold T2 in step 324. Threshold T2 is stored in RAM 276 and represents a second decision point to change between ADC paths 220 and 230 or possibly mix the ADC paths 220 and 230. In one embodiment, threshold T2 can be a digital equivalent of −100 dB. More generally, threshold T2 is greater than threshold T1. The digital representation of the analog input signal $A_{IN}$ could be in a range that varies in value greater than threshold T2 to a value less than threshold T1, and anywhere in between. If input A is greater than threshold T2, then input A from ADC path 220 is selected as the present setpoint, as per step 326. If input A is not greater than threshold T2, and input A is not less than threshold T1 as per step 324, then input A is somewhere between threshold T1 and threshold T2. In that case, input A and input B are blended, mixed, or otherwise combined as the present setpoint based on signal amplitude, as per step 330.

Figure 7A:
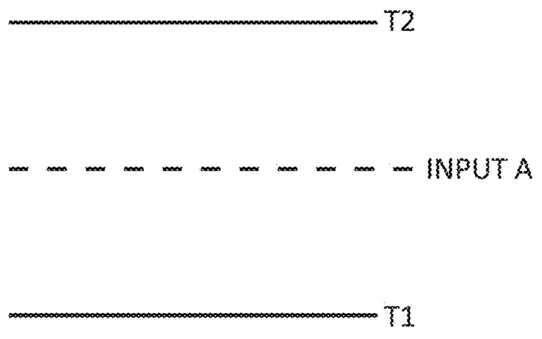
FIGS. 7*a*-7*c* illustrate the mixing operation of the distributed DPUs.
Figure 7B:
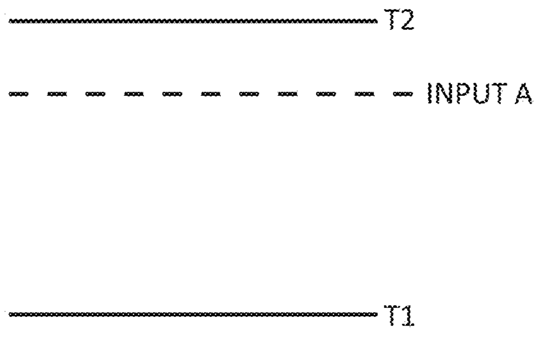
Figure 7C:
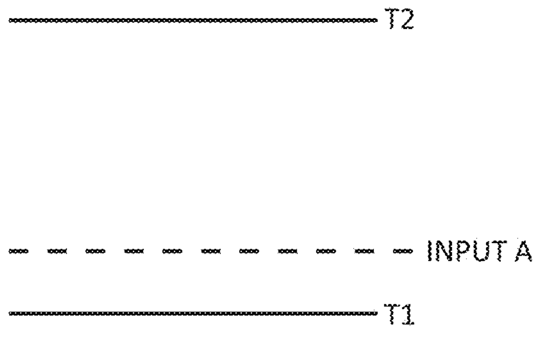
Figure 8:
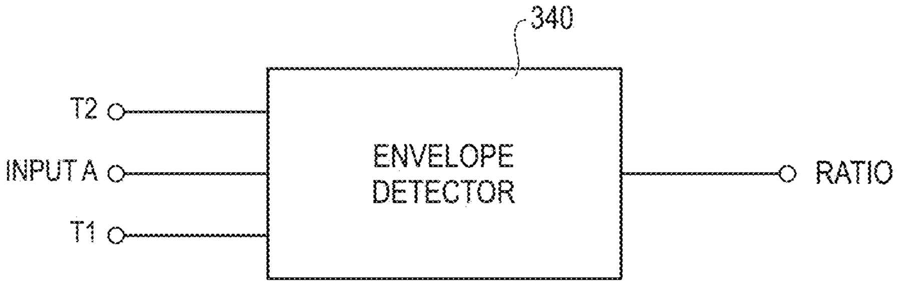
FIG. 8 illustrates an envelope detector to determine a ratio between the digital signal and thresholds T1 and T2.

DPU 274 chooses input A from ADC path 220 if input A is greater than threshold T2 and chooses input B from DPU 284 if input A is less than threshold T1. If input A is between threshold T1 and threshold T2, then input A from ADC path 220 and input B from DPU 284 are blended, mixed, or otherwise combined. The value of input B from DPU 284 can be input A from DPU 284, or input B from DPU 294, or a blending, mixing, or other combination of input A from DPU 284 and input B from DPU 294. As an example, FIG. 7*a* shows input A closer to threshold T2. DPU 274 can use an envelope detector to measure the relative position or proximity of input A to threshold T1 and threshold T2. FIG. 8 shows a representative block diagram envelope detector 340 measuring input A and threshold T1 and threshold T2. Envelope detector 340, implemented by the program coding within DPU 274, creates a monotonic ratio or linear weight factor between 0.0 and 1.0 of the relative position or proximity of input A to threshold T1 and threshold T2. Given that input A, threshold T1, and threshold T2 are all known, envelope detector 340 is a digital operation executed by the program coding to determine the ratio of the relative position or proximity of input A between threshold T1 and threshold T2. Assume envelope detector 340 determines that input A is 0.8 of the delta between threshold T1 and threshold T2, as shown in FIG. 7*a*. The algorithm takes 0.8 of input A and 0.2 of input B in the mixing of input A and input B. More specifically, the mixing of input A and input B is a digital operation that would determine the mixed signal as (0.8*input A)+(0.2*input B). FIG. 7*b* shows input A about equal distance between threshold T2 and threshold T1. Assume envelope detector 340 determines that input A is 0.5 of the delta between threshold T1 and threshold T2. The algorithm takes 0.5 of input A and 0.5 of input B in the mixing of input A and input B. In this case, the mixed signal would be (0.5*input A)+(0.5*input B). FIG. 7*c* shows input A closer to threshold T1. Assume envelope detector 340 determines that input A is 0.2 of the delta between threshold T1 and threshold T2. The algorithm takes 0.2 of input A and 0.8 of input B in the mixing of input A and input B. In this case, the mixed signal would be (0.2*input A)+(0.8*input B). DPU 274 is executing a linear mixing based on the relative position or proximity of input A to threshold T1 and threshold T2. In the limits of threshold T2, the linear weight factor approaches 1.0 of input A. In the limits of threshold T1, the linear weight factor approaches 0.0 of input A. Between threshold T1 and threshold T2, the linear weight factor is based on the relative position or proximity of input A between the thresholds, as described above.

Now consider DPU 284. Threshold T1 is stored in RAM 286 and represents a first decision point to change between ADC paths 230 and 240 or possibly mix ADC paths 230 and 240. If input A is less than threshold T1, then input B from DPU 294 is selected as the present setpoint, as per step 322. Input B from DPU 294 is the digital representation of the analog input signal $A_{IN}$ from ΣΔ ADC 242. If input A is not less than threshold T1, then input A is compared to threshold T2 in step 324. Threshold T2 is stored in RAM 286 and represents a second decision point to change between ADC paths 230 and 240 or possibly mix ADC paths 230 and 240. Again, threshold T2 is greater than threshold T1. If input A is greater than threshold T2, then input A from ADC path 230 is selected as the present setpoint, as per step 326. If input A is not greater than threshold T2, and input A is not less than threshold T1 as per step 324, then input A is somewhere between threshold T1 and threshold T2. In that case, input A and input B are blended, mixed, or otherwise combined as the present setpoint based on signal amplitude, as per step 330.

DPU 284 chooses input A from ADC path 230 if input A is greater than threshold T2 and chooses input B from ADC path 240 if input A is less than threshold T1. If input A is between threshold T1 and threshold T2, then input A from ADC path 230 is blended, mixed, or otherwise combined with input B from DPU 294, as described for DPU 274.

DPU 294 has no input B so its output is the digital representation of the analog input signal $A_{IN}$ from ΣΔ ADC 242, i.e., input A of DPU 294. Alternatively, a reference input B could be provided to DPU 294 (not shown) and its processing would proceed as described for DPUs 274 and 284.

Thresholds T1 and T2 represent the decision points to switch between ADC paths with their associated gains, or to mix the ADC paths, to benefit from the present noise floor and optimize the digital representation of the analog input signal $A_{IN}$. For example, based on its algorithm, DPU 274 could switch to a higher gain of ADC path 230 to benefit from the lower noise floor. DPU 284 could switch to a higher gain of ADC path 240 to benefit from the lower noise floor. Given a change in the noise floor, input level based on mixing involves a gradual input level based mixing in addition to time based gradual and programmable transition range, before overload sets in, resulting in less distortion. DPUs 274, 284, and 294 are each performing internal signal processing involving the determination of the signal input levels and determining continuous transitioning mixing factor to merge the signal pairs into a weighted average that is the optimal representation of the analog input signal $A_{IN}$, while correcting for lack of phase coherence and differing gain. The distributed, daisy-chained signal processing network 246 performs local pair-wise mixing of channels at each ADC path 220, 230, and 240. In step 332, the output signal of MGM 200 is transitioned to the present setpoint with a programmed time constant.

Figure 9:
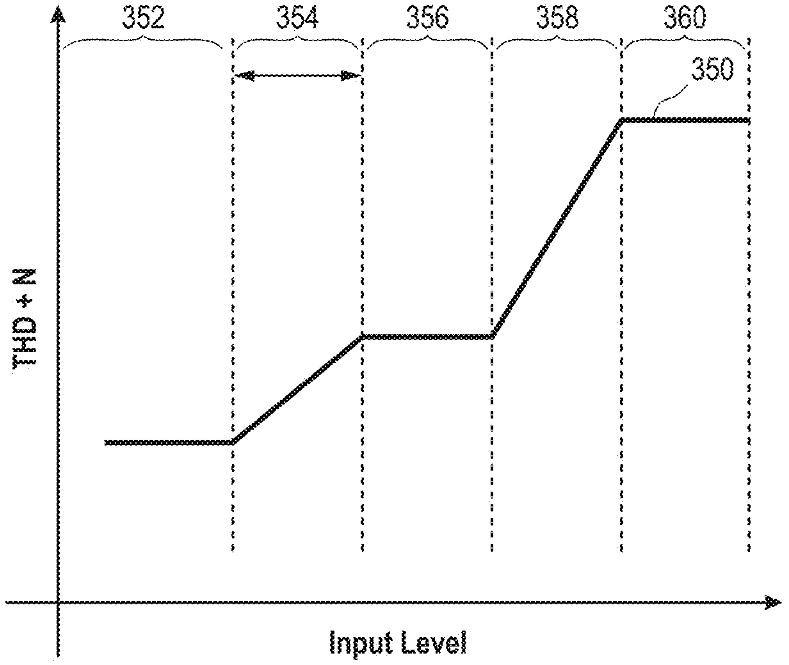
FIG. 9 is a plot of THD+N vs. input level of the ADC of FIGS. 4-5.

Distributed signal processing network 246 takes into account the amplitude or signal level of the analog input signal $A_{IN}$ as well as noise level in determining the optimal digital representation thereof. FIG. 9 shows a graph 350 of total harmonic distortion and noise (THD+N) versus amplitude or signal level of the analog input signal $A_{IN}$. THD+N represents the noise level of the ADC path. Since each ADC path 220, 230, and 240 have a different gain for FGAs 208, 210, and 212, respectively, each ADC path has a different noise floor. In region 352, ΣΔ ADC 242 is computing its digital representation of the analog input signal $A_{IN}$ with the gain of FGA 212. Region 354 is a programmable transition period, based on an increase in the magnitude of the analog input signal $A_{IN}$. MGM 200 mixes or blends between ADC path 240 and ADC path 230 during programmable transition period 354. If the amplitude or signal level of the analog input signal $A_{IN}$ is too high, relative to the gain of FGA 212, then ADC path 230 is selected as preferrable in terms of noise level. In other words, as THD+N increases with input signal level during the programmable transition period 354, then MG ADC path 230 is selected as preferrable. In region 356, ΣΔ ADC 232 is computing its digital representation of the analog input signal $A_{IN}$ with the gain of FGA 210. Region 358 is a programmable transition period, based on an increase in the amplitude or signal level of the analog input signal $A_{IN}$. MGM 200 mixes or blends between ADC path 230 and ADC path 220 during programmable transition period 358. If the amplitude or signal level of the analog input signal $A_{IN}$ is too high, relative to the gain of FGA 210, then ADC path 220 is selected as preferrable in terms of noise level. In other words, as THD+N increases with input signal level during the programmable transition period 358, then ADC path 220 is selected as preferrable. In region 360, ΣΔ ADC 222 is computing its digital representation of the analog input signal $A_{IN}$ with the gain of FGA 208.

MGM 200, having multiple paths at fixed different gains, avoids having to dynamically step the gain instantly when trying to keep the input signal from overloading the path, as noted in the background. Instead, the outputs of ADC paths 220, 230, and 240 are mixed using a weighting on each path such that the sum of the weights are constant, and the weight of any path that is clipping or overloaded is reduced to zero. The mixing weights are completely removed from the analog paths, thus removing the need to switch for specific input signal conditions. The mixing weights can be more precise due to the fact the weights do not need to be associated to the analog gain values of previous architectures. Another benefit from MGM 200 is that when the signals of multiple ADC paths 220, 230, 240 are all within the range of the respective ΣΔ ADCs 222, 232, and 242, the MGM algorithm can automatically calibrate in real-time the paths digital gain, thereby removing the need to precisely know each analog gain step used in previous architectures. Also, the DC offset of the multiple ADC paths 220, 230, and 240 of MGM 200 can be automatically matched in real-time, making the signal transitions immune to DC steps, even without the requirement for DC blocking filters. Another notable improvement in using multiple fixed gain paths vs. a variable gain single path is that the frequency response on and phase response of the front-end amplifier are fixed, allowing for high frequency signals to also be able to be seamlessly mixed together. Architectures that depend on switching the gain of a PGA to zoom into the small signals suffer from the phase shift occurring in the PGA, making higher frequency signals have different phase shifts at the different gains, changing the latency of the dynamic gain architecture to be a function of the PGA gain used. MGM 200 removes such audible artifacts. MGM 200 with distributed signal processing network 246 reduces complexity and cost, eliminates IO latency, and lowers power consumption.

Figure 10A:
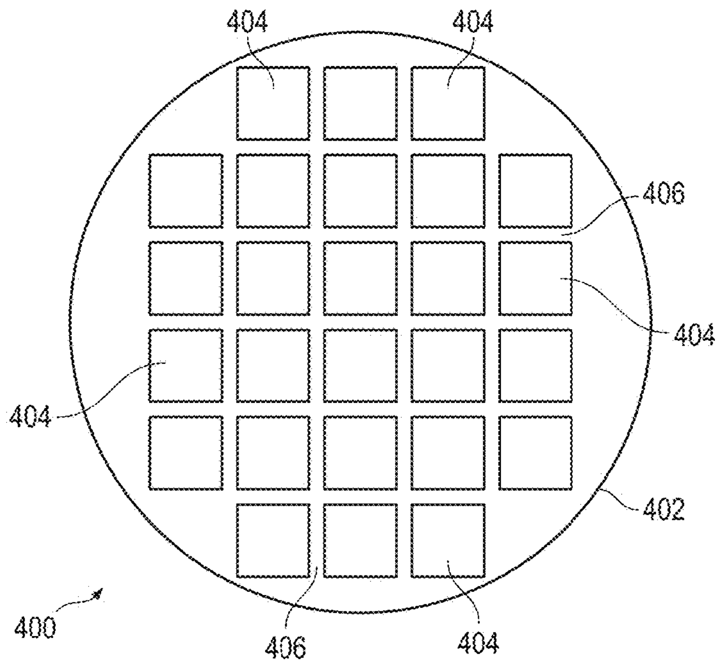
FIGS. 10*a*-10*c* illustrate a semiconductor wafer with a plurality of semiconductor die implementing the ADC.

FIG. 10*a* shows a semiconductor wafer 400 with a base substrate material 402, such as silicon, germanium, aluminum phosphide, aluminum arsenide, gallium arsenide, gallium nitride, indium phosphide, silicon carbide, or other bulk material for structural support. A plurality of semiconductor die or components 404 is formed on wafer 400 separated by a non-active, inter-die wafer area or saw street 406. Saw street 406 provides cutting areas to singulate semiconductor wafer 400 into individual semiconductor die 404. In one embodiment, semiconductor wafer 400 is circular with a diameter of 100-450 millimeters (mm). Semiconductor wafer 400 can be rectangular or any other geometric shape.

Figure 10B:
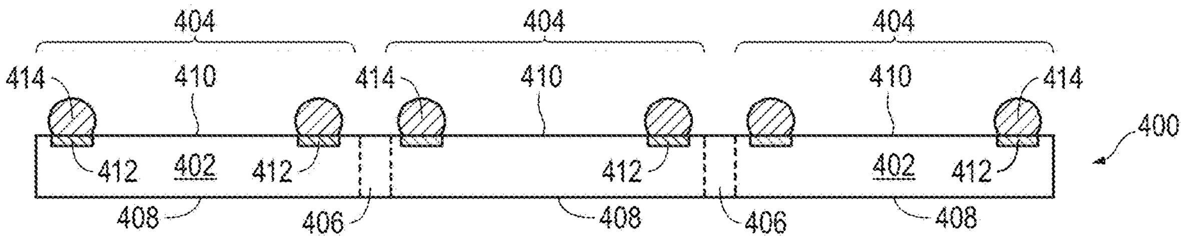

FIG. 10*b* shows a cross-sectional view of a portion of semiconductor wafer 400. Each semiconductor die 404 has a back or non-active surface 408 and an active surface 410 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 10 to implement analog circuits or digital circuits, such as FGAs 208, 210, and 212, ΣΔ ADCs 222, 232, and 242, decimation filters 270, 280, and 290, DPUs 274, 284, and 294, and RAM 276, 286, and 296, digital signal processor (DSP), application specific integrated circuits (ASIC), memory, or other signal processing circuit. Semiconductor die 404 may also contain integrated passive devices (IPDs), such as inductors, capacitors, and resistors, for RF signal processing.

An electrically conductive layer 412 is formed over active surface 410 using PVD, CVD, electrolytic plating, electroless plating process, or other suitable metal deposition process. Conductive layer 412 can be one or more layers of aluminum (Al), copper (Cu), tin (Sn), nickel (Ni), gold (Au), silver (Ag), or other suitable electrically conductive material. Conductive layer 412 operates as contact pads electrically connected to the circuits on active surface 410.

An electrically conductive bump material is deposited over conductive layer 412 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 412 using a suitable attachment or bonding process. In one embodiment, the bump material is reflowed by heating the material above its melting point to form balls or bumps 414. In one embodiment, bump 414 is formed over an under bump metallization (UBM) having a wetting layer, barrier layer, and adhesive layer. Bump 414 can also be compression bonded or thermocompression bonded to conductive layer 412. Bump 414 represents one type of interconnect structure that can be formed over conductive layer 412. The interconnect structure can also use bond wires, conductive paste, stud bump, micro bump, or other electrical interconnect.

Figure 10C:
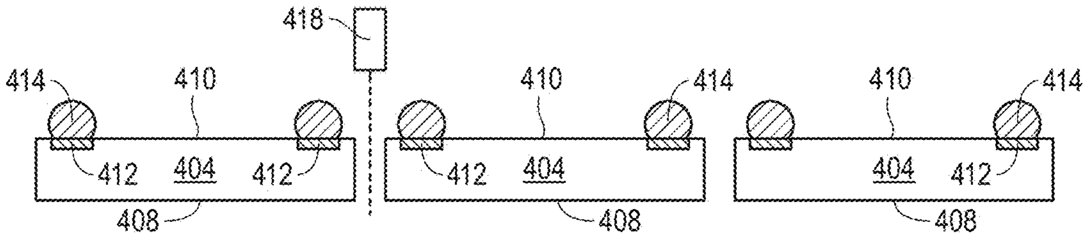

In FIG. 10*c*, semiconductor wafer 400 is singulated through saw street 406 using a saw blade or laser cutting tool 418 into individual semiconductor die 404. The individual semiconductor die 404 can be inspected and electrically tested for identification of known good die or unit (KGD/KGU) post singulation.

Figure 11A:
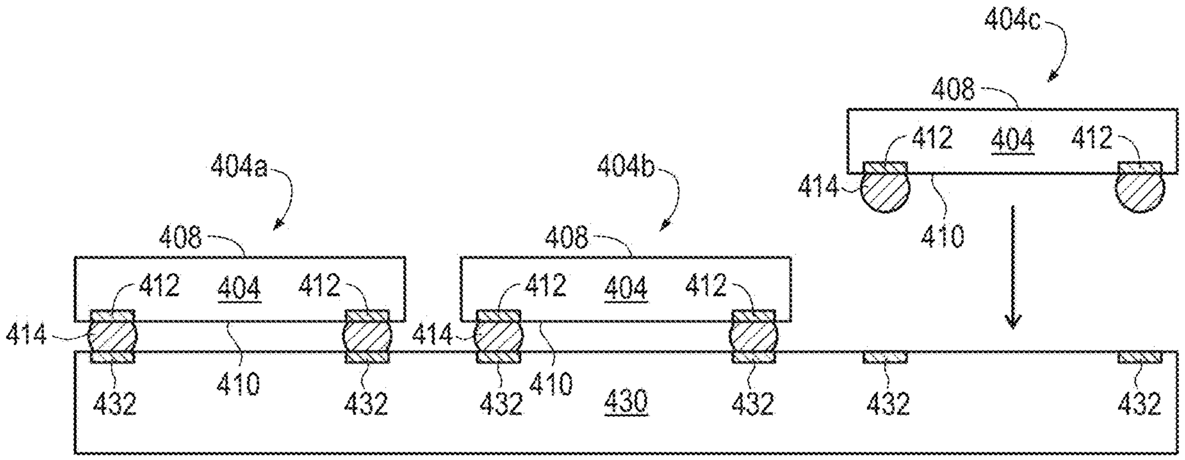
FIGS. 11*a*-11*b* illustrate the ADC distributed among multiple semiconductor die.
Figure 11B:
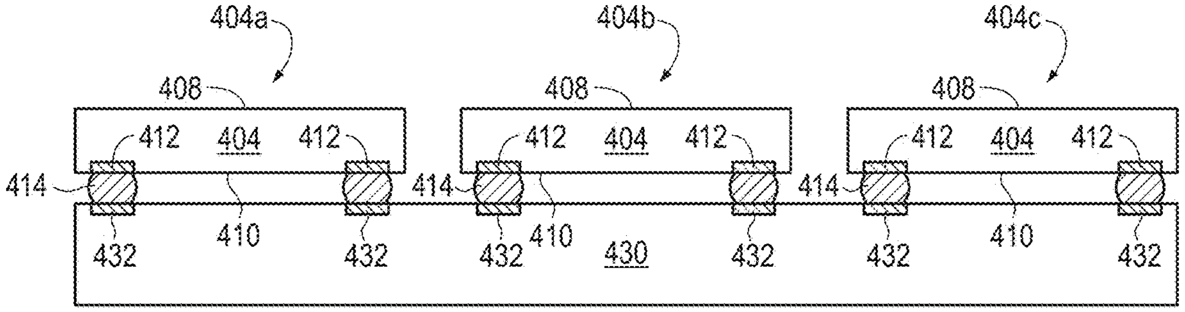

FIG. 11*a* shows semiconductor die 404*a*, 404*b*, and 404*c* from FIGS. 10*a*-10*c* disposed over substrate 430 using a pick and place operation. Bumps 414 are aligned with conductive layer 432 on substrate 430. Bumps 414 are mechanically and electrically bonded to conductive layer 432. FIG. 11*b* shows semiconductor die 404*a*, 404*b*, and 404*c* mounted to substrate 430. Semiconductor die 404*a*, 404*b*, and 404*c* can send and receive electrical signals through conductive layer 432. In one embodiment, mixed signal electrical circuit 160 from FIG. 3 is at least partially implemented on semiconductor die 404*a*. Alternatively, mixed signal electrical circuit 160 is at least partially implemented on semiconductor die 404*b* or 404*c*. As described above, MGM 200 uses a distributed signal processing network 246. Accordingly, ADC path 220 can be implemented on semiconductor die 404*a*, while ADC path 230 is implemented on semiconductor die 404*b*, and ADC path 240 is implemented on semiconductor die 404*c*. DPU 274 operates within semiconductor die 404*a*, while DPU 284 operates within semiconductor die 404*b*, and DPU 294 operates within semiconductor die 404*c*, as distributed signal processing network 246. FGAs 208, 210, and 212 can be implemented on one semiconductor die 404 and ADC paths 220, 230, and 240 can be implemented on one or more different semiconductor die 404. The signal processing is distributed between semiconductor die 404*a*-404*c* and communicates through substrate 430 and conductive layer 432. Additional semiconductor die like 404, each with their own ADC path and DPU, can be added to substrate 430 to expand distributed signal processing network 246.

While one or more embodiments of the present invention have been illustrated in detail, the skilled artisan will appreciate that modifications and adaptations to those embodiments may be made without departing from the scope of the present invention as set forth in the following claims.

What is claimed:

1. An analog to digital converter (ADC) circuit, comprising:

a plurality of distributed ADC paths each receiving a common analog input signal and providing a digital output signal, each distributed ADC path including, (a) an ADC converting the common analog input signal to a digital signal, and (b) a digital processing unit (DPU) coupled to an output of the ADC;

wherein a first DPU of a first distributed ADC path receives a first digital signal from a first ADC of the first ADC path and a second digital signal from a second DPU of a second distributed ADC path and selects a mixture of the first digital signal and second digital signal as the digital output signal based on a proximity of the first digital signal to a first threshold and a second threshold.

2. The ADC circuit of claim 1, wherein the first DPU selects the second digital signal as the digital output signal when the first digital signal is less than the first threshold, and the first DPU selects the first digital signal as the digital output signal when the first digital signal is greater than the second threshold.

3. The ADC circuit of claim 1, wherein the first DPU selects a mixture of the first digital signal and second digital signal as the digital output signal when the first digital signal is between the first threshold and the second threshold.

4. The ADC circuit of claim 3, wherein the mixture of the first digital signal and second digital signal is determined based on a monotonic ratio of the proximity of the first digital signal relative to the first threshold and the second threshold.

5. The ADC circuit of claim 1, wherein each ADC path includes a fixed gain amplifier comprising an input coupled for receiving the analog input signal and an output coupled to an input of the ADC.

6. The ADC circuit of claim 1, wherein the DPU includes a state machine.

7. A semiconductor device, comprising a plurality of analog to digital conversion (ADC) paths each receiving an analog input signal and providing a digital output signal, wherein a first digital processing unit (DPU) of a first ADC path receives a first digital signal from a first ADC of the first ADC path and a second digital signal from a second DPU of a second ADC path and selects a mixture of the first digital signal and second digital signal as the digital output signal when the first digital signal is between a first threshold and a second threshold.

8. The semiconductor device of claim 7, wherein the first DPU selects the second digital signal as the digital output signal when the first digital signal is less than the first threshold, and the first DPU selects the first digital signal as the digital output signal when the first digital signal is greater than the second threshold.

9. The semiconductor device of claim 7, wherein the mixture of the first digital signal and second digital signal is determined based on a monotonic ratio of a proximity of the first digital signal relative to the first threshold and the second threshold.

10. The semiconductor device of claim 7, wherein the plurality of ADC paths is implemented into a distributed network.

11. The semiconductor device of claim 7, wherein the ADC is a sigma delta ADC.

12. The semiconductor device of claim 7, wherein each ADC path includes a fixed gain amplifier comprising an input coupled for receiving the analog input signal and an output coupled to an input of the first ADC.

13. The semiconductor device of claim 7, further including a decimation filter in the first ADC path.

14. A method of making an analog to digital converter (ADC) circuit, comprising:

providing a plurality of ADC paths each receiving an analog input signal and providing a digital output signal; and providing a first digital processing unit (DPU) of a first ADC path to receive a first digital signal from a first ADC of the first ADC path and a second digital signal from a second DPU of a second ADC path and select a mixture of the first digital signal and second digital signal as the digital output signal when the first digital signal is between a first threshold and a second threshold.

15. The method of claim 14, further including selecting the second digital signal as the digital output signal when the first digital signal is less than the first threshold, and the first DPU selects the first digital signal as the digital output signal when the first digital signal is greater than the second threshold.

16. The method of claim 14, determining the mixture of the first digital signal and second digital signal based on a linear ratio of a proximity of the first digital signal relative to the first threshold and the second threshold.

17. The method of claim 14, further including organizing the plurality of ADC paths into a distributed network.

18. The method of claim 14, wherein the first ADC is a sigma delta ADC.

19. The method of claim 14, further including providing a fixed gain amplifier comprising an input coupled for receiving the analog input signal and an output coupled to an input of the first ADC.

20. The method of claim 14, further including providing a decimation filter in the first ADC path.

* * * * *